(12) United States Patent
Chakravarti et al.

(10) Patent No.: US 8,173,524 B1
(45) Date of Patent: May 8, 2012

(54) PROCESS FOR EPITAXIALLY GROWING EPITAXIAL MATERIAL REGIONS

(75) Inventors: Ashima B. Chakravarti, Hopewell Junction, NY (US); Anthony I. Chou, Beacon, NY (US); Abhishek Dube, Fishkill, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/004,201

(22) Filed: Jan. 11, 2011

(51) Int. Cl.
*H01L 21/20* (2006.01)
*H01L 21/36* (2006.01)

(52) U.S. Cl. ......... 438/481; 257/E21.461; 257/E21.562; 438/230; 438/503; 438/507

(58) Field of Classification Search ............. 257/E21.09, 257/E21.092, E21.099, E21.102, E21.115, 257/E21.461, E21.562; 438/230, 481, 503, 438/507
See application file for complete search history.

(56) References Cited

U.S. PATENT DOCUMENTS

| 4,948,456 | A | 8/1990 | Schubert |
| 5,185,286 | A | 2/1993 | Eguchi |
| 5,516,589 | A | 5/1996 | Nii |
| 7,057,216 | B2 | 6/2006 | Ouyang et al. |
| 7,348,248 | B2 | 3/2008 | Cheng |
| 7,482,656 | B2 | 1/2009 | Luo et al. |
| 7,572,712 | B2 | 8/2009 | Chong et al. |
| 2007/0004123 | A1* | 1/2007 | Bohr et al. ............. 438/230 |
| 2007/0298593 | A1 | 12/2007 | Yu et al. |
| 2009/0159938 | A1* | 6/2009 | Nuttinck et al. ........... 257/288 |

OTHER PUBLICATIONS

IBM TDB, Ginsberg et al., "New Method for Fabricating Silicon-On-Insulator Structures Using Selective Epitaxial Lateral Growth", Nov. 1, 1990, TDB n6b 11-90, p. 387-389.

* cited by examiner

*Primary Examiner* — Asok Sarkar
(74) *Attorney, Agent, or Firm* — Gibb I.P. Law Firm, LLC; Yuanmin Cai, Esq.

(57) ABSTRACT

Methods form epitaxial materials by forming at least two gate stacks on a silicon substrate and forming sidewall spacers on sides of the gate stacks. Such methods pattern a recess in the silicon substrate between adjacent ones of the gate stacks. The methods also provide a liner in a bottom of the recess, and epitaxially grow epitaxial material from sidewalls of the recess to fill the recess with the epitaxial material.

24 Claims, 7 Drawing Sheets

US 8,173,524 B1

PROCESS FOR EPITAXIALLY GROWING EPITAXIAL MATERIAL REGIONS

BACKGROUND

The present invention relates to the manufacture of integrated circuit devices, and more specifically, to the formation of epitaxial material regions between gate stacks within transistor integrated circuits.

Modern integrated circuit devices utilize various solid-state elements such as transistors. Generally, transistors (such as field effect transistors (FET)) include a semiconductor channel region between conductive source and drain regions. The semiconductor channel region in an FET is changed from non-conducting state to a conducting state based on the presence of a voltage field generated by the gate conductor. Similarly, diodes utilize semiconductor regions to control current flow between the anode and the cathode and, in the same way, bipolar junction transistors control current flow based upon the semiconductor nature of the collector, emitter, and base.

One recent advance within integrated circuit technology is the use of epitaxial silicon carbon source/drain regions adjacent the semiconductor channel regions. Such epitaxial material regions provide a greater mechanical stress which increases carrier mobility and transistor drive current for such integrated circuit devices. However, it is often difficult to form epitaxial material regions that are free of defects and that have a consistent lattice network.

SUMMARY

Various methods herein form epitaxial materials by forming at least two gate stacks on a silicon substrate and forming sidewall spacers on sides of the gate stacks. Such methods pattern a recess in the silicon substrate between adjacent ones of the gate stacks. The methods also provide a liner (such as an oxide liner) in a bottom of the recess, and epitaxially grow material from sidewalls of the recess to fill the recess with the epitaxial material.

Other methods herein form at least two gate stacks on a silicon substrate, and form sidewall spacers on sides of the gate stacks. The methods pattern a recess in the silicon substrate between adjacent ones of the gate stacks, provide a liner along sidewalls of the recess, and epitaxially grow material from a bottom of the recess to fill the recess with the epitaxial material.

Additional methods also form at least two gate stacks on a silicon substrate, and form sidewall spacers on sides of the gate stacks. Such methods pattern a recess in the silicon substrate between adjacent ones of the gate stacks and provide a liner along sidewalls of the recess. The methods epitaxially grow a first epitaxial material from a bottom of the recess to fill the recess with the epitaxial material. Further, these methods remove the liner from the sidewalls of the recess to create gaps between the sidewalls of the recess and sidewalls of the first epitaxial material, and epitaxially grow a second epitaxial material from the sidewalls of the recess to fill the gaps with the second epitaxial material.

Further methods herein form at least two gate stacks on a silicon substrate, and form sidewall spacers on sides of the gate stacks. These methods pattern a recess in the silicon substrate between adjacent ones of the gate stacks, provide a conductor or semiconductor along sidewalls of the recess, and epitaxially grow material from a bottom of the recess to fill the recess with the epitaxial material.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

Figure 1:
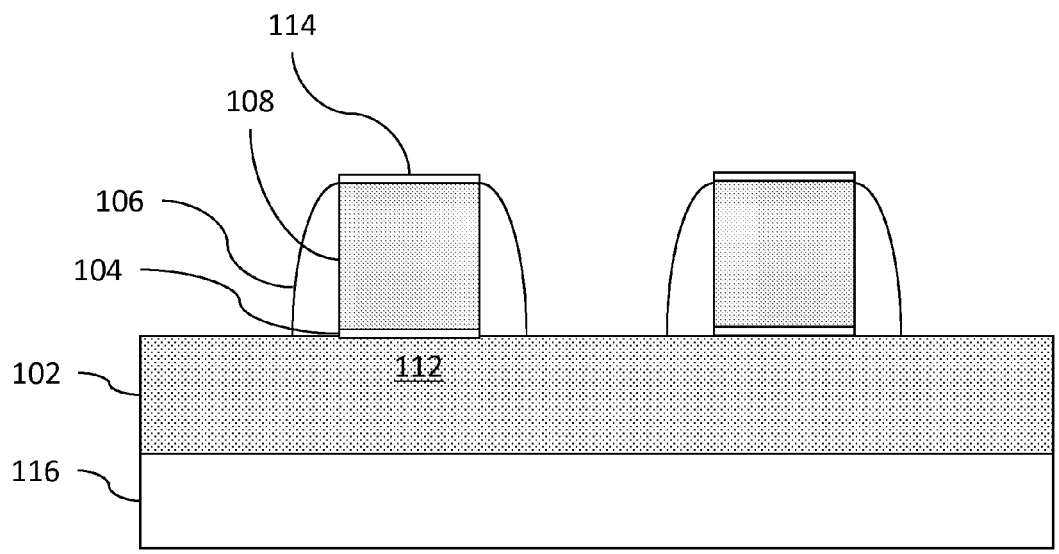
FIG. 1 is a cross-sectional schematic diagram of an integrated circuit device according to embodiments herein.

As mentioned above, it is often difficult to form silicon carbon regions that are free of defects and that have a consistent lattice network. In order to address such issues, the embodiments herein form silicon carbon regions within trenches adjacent the semiconductor regions of integrated circuit devices, and epitaxially grow silicon carbon along a single lattice plane of the silicon substrate material within the trenches. In one example, the embodiments herein epitaxially grow silicon carbon only from the bottom surface of the trenches, and in another example the embodiments herein epitaxially grow silicon carbon only from the parallel sidewalls of the trenches. These processes produce silicon carbon material that all has the same crystalline orientation, which reduces or eliminates defects that occur when the silicon carbon material has many different crystalline orientations.

Referring now to the drawings, FIGS. 1-10 illustrate a partially completed transistor structure in cross-sectional view. While field effect transistors have been chosen as the structure to illustrate the operation of embodiments herein, those ordinarily skilled in the art would understand that the embodiments herein are equally applicable to many different integrated circuit devices, such as diodes, bipolar junction transistors, avalanche transistors, and all other types of semiconductor-based devices (whether currently known or developed in the future). Therefore, it is intended that the use of a single type of transistor (FET) as the exemplary structure to illustrate embodiments herein should not limit the type of structure to which the embodiments herein can be applied, and it is intended that embodiments herein can be implied to any form of integrated circuit device.

The transistor structure illustrated in FIG. 1 includes a substrate that has a buried oxide region 116 and then overlying silicon region 102. This type of substrate is sometimes referred to as a silicon-on-insulator (SOI) substrate. As would be understood by those ordinarily skilled in the art, the substrate could omit the buried oxide reaching 100 and simply be bulk silicon 102.

Such a "substrate" herein can comprise any material appropriate for the given purpose (whether now known or developed in the future) and can comprise, for example, Si, SiC, SiGe, SiGeC, Ge alloys, GaAs, InAs, TnP, other III-V or II-VI compound semiconductors, or organic semiconductor structures, etc. The "shallow trench isolation" (STI) structures are well-known to those ordinarily skilled in the art and are generally formed by patterning openings/trenches within the substrate and growing or filling the openings with a highly insulating material (this allows different active areas of the substrate to be electrically isolated from one another).

Generally, transistor structures are formed by depositing or implanting impurities into a substrate to form at least one semiconductor channel region 112, bordered by shallow trench isolation regions below the top (upper) surface of the substrate. Within a transistor, the semiconductor (or channel region) is positioned between a conductive "source" region and a similarly conductive "drain" region and when the semiconductor is in a conductive state, the semiconductor allows electrical current to flow between the source and drain. A "gate" 108 is a conductive element that is electrically separated from the semiconductor 112 by a "gate oxide" 104 (which is an insulator) and current/voltage within the gate 108 changes the conductivity of the channel region of the transistor. In addition a capping material 114 may be formed to protect the gate conductor 108.

Sidewall spacers 106 are also formed on the sidewalls of the gate conductor 108. For purposes herein, "sidewall spacers" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

A positive-type transistor "P-type transistor" uses impurities such as boron, aluminum or gallium, etc., within a semiconductor substrate (to create deficiencies of valence electrons) as a semiconductor source/drain region. Similarly, an "N-type transistor" is a negative-type transistor that uses impurities such as antimony, arsenic or phosphorous, etc., within a semiconductor substrate (to create excessive valence electrons) as a semiconductor source/drain region.

For purposes herein, a "semiconductor" is a material or structure that may include an implanted impurity that allows the material to sometimes be a conductive and sometimes be non-conductive, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

Figure 2:
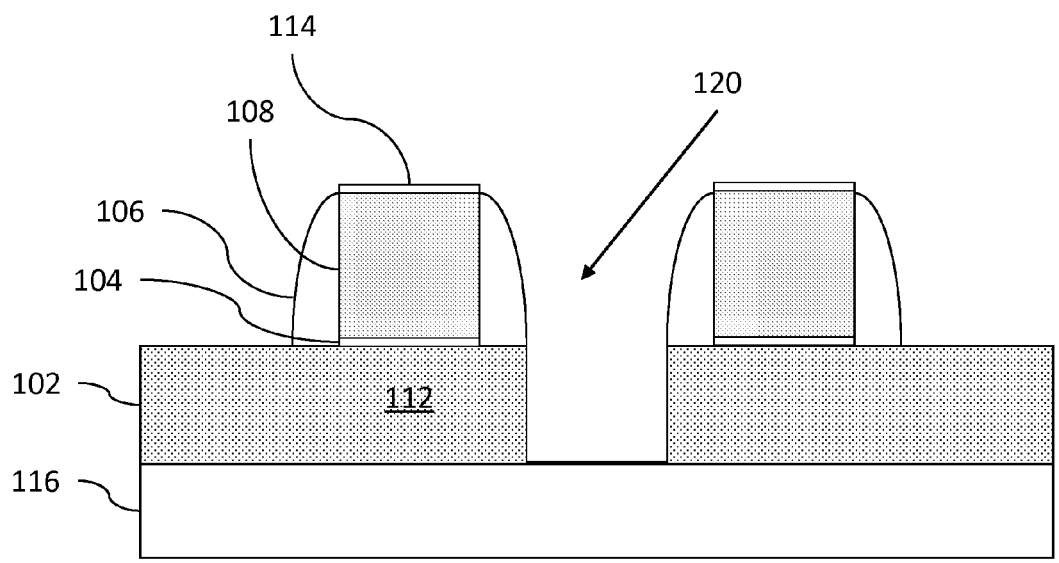
FIG. 2 is a cross-sectional schematic diagram of an integrated circuit device according to embodiments herein.

As shown in FIG. 2, various methods herein pattern a recess 120 in the silicon substrate 102 between adjacent ones of the gate stacks. When patterning the recess 120, the methods utilize the sidewall spacers 106 as alignment features. When patterning any material herein, the material to be patterned can be grown or deposited in any known manner and a patterning layer (such as an organic photoresist) can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the region of the resist that was exposed to the light. Then one region of the resist can be rinsed off, leaving the other region of the resist to protect the material to be patterned. A material removal process is then performed (e.g., plasma etching, etc.) to remove the unprotected regions of the material to be patterned. The resist is subsequently removed to leave the underlying material patterned according to the light exposure pattern.

Figure 3:
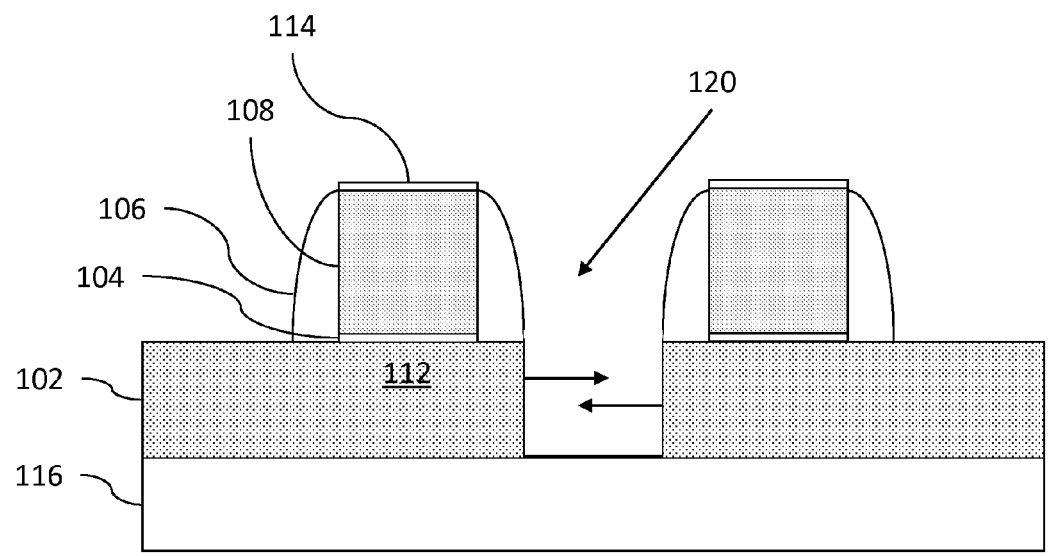
FIG. 3 is a cross-sectional schematic diagram of an integrated circuit device according to embodiments herein.

As shown in FIGS. 2 and 3, the recess 120 is formed completely through the silicon substrate layer 102 exposing the underlying buried oxide 116. Then, as shown in FIG. 3, the embodiments herein epitaxially grow silicon material from the sidewalls of the trench 120. As is understood by those ordinarily skilled in the art, an epitaxial growth process utilizes heat, pressure, and the combination of various gaseous materials to grow additional material on an exposed surface. The embodiments herein can epitaxially grow any material such as silicon carbon, silicon germanium, etc. In the following examples, silicon carbon is used as the epitaxial material; however, silicon carbon is only an example of one material that can be used with embodiments herein and those ordinarily skilled in the art would understand that any different epitaxial material (whether currently known or developed in the future) could be utilized with embodiments herein. Therefore, for convenience of illustration, the terms silicon carbon and epitaxial material are used to represent all such epitaxial materials.

Thus, this process selectively grows silicon carbon material on the exposed silicon sidewalls of the trench 120, but does not grow any material on the insulator (oxide) material of the buried oxide layer 116. As the epitaxial material grows, it maintains the crystal lattice structure of the material from which it is grown. These crystal lattice orientations are commonly referred to utilizing three numeral designations to indicate the X, Y, and Z orientations of the crystals. As is understood by those ordinarily skilled in the art, these orientations are generally referred to as 100, 110, and 111, and they are orientations relative to the original crystalline orientation of a given structure, such as the silicon layer 102.

Figure 4:
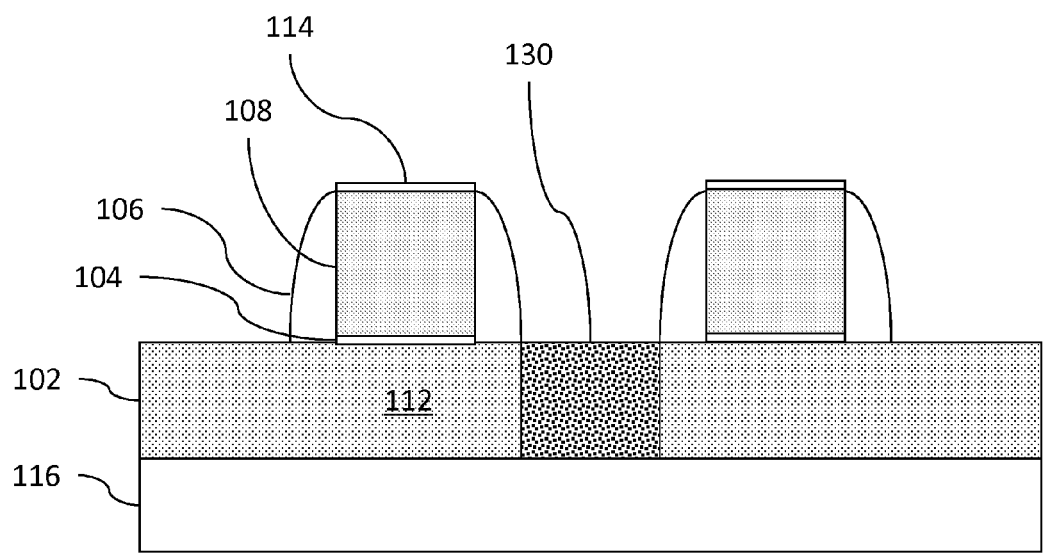
FIG. 4 is a cross-sectional schematic diagram of an integrated circuit device according to embodiments herein.

As shown in FIG. 4, this process produces a silicon carbon region 130. This silicon carbon region has a uniform crystalline orientation along the 110 plane relative to the lattice structure of the silicon substrate 102 because the material is uniformly grown from each of the sidewalls of the trench 120. The uniform nature of the crystalline orientation of the silicon carbon reduces the amount of defects within the silicon carbon region 130.

Figure 5:
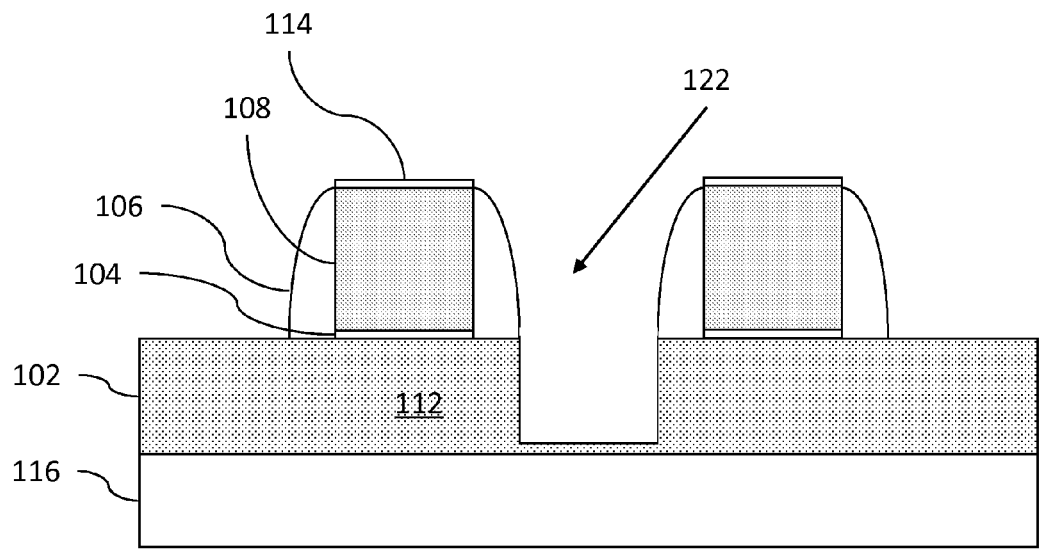
FIG. 5 is a cross-sectional schematic diagram of an integrated circuit device according to embodiments herein.
Figure 6:
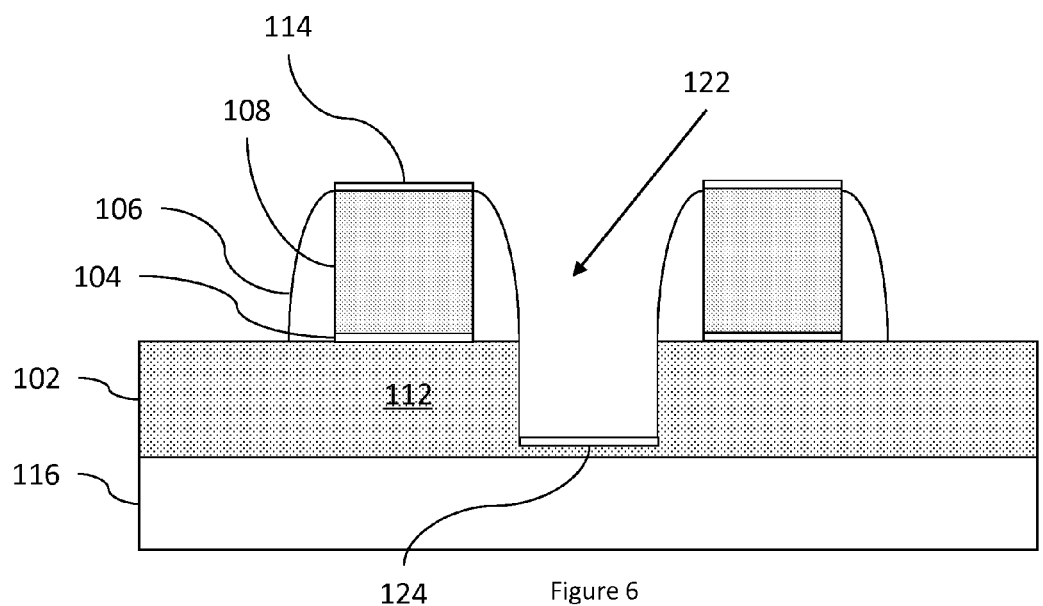
FIG. 6 is a cross-sectional schematic diagram of an integrated circuit device according to embodiments herein.
Figure 7:
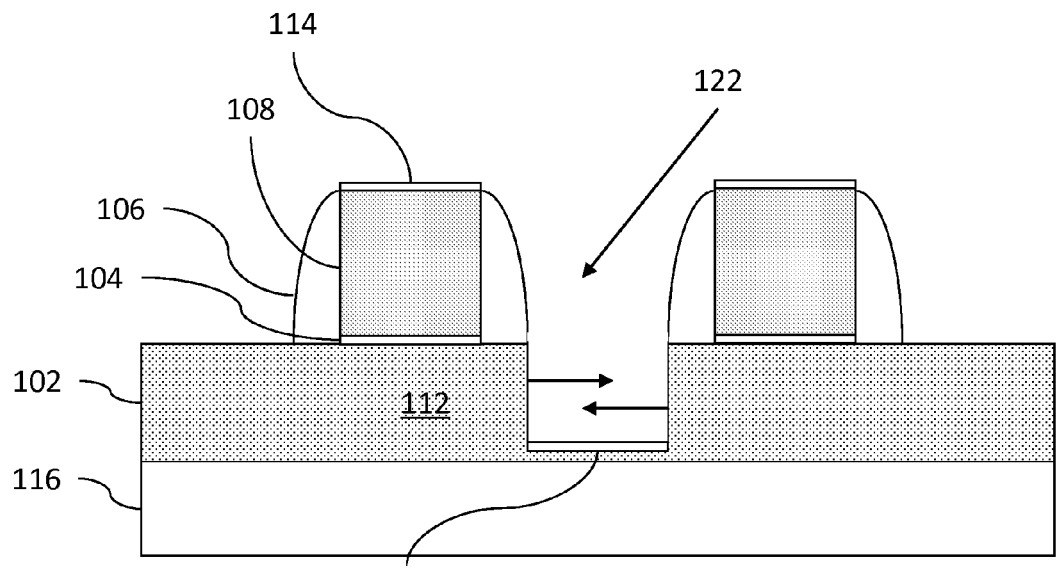
FIG. 7 is a cross-sectional schematic diagram of an integrated circuit device according to embodiments herein.
Figure 8:
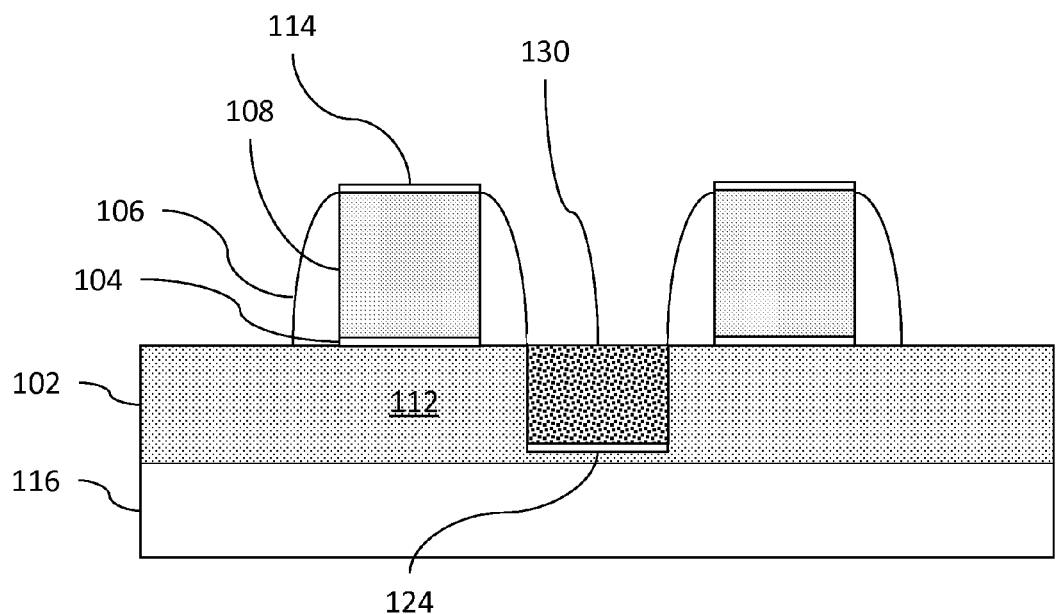
FIG. 8 is a cross-sectional schematic diagram of an integrated circuit device according to embodiments herein.

FIG. 5 illustrates a structure that is similar to that illustrated in FIG. 2, discussed above. However, in FIG. 5, the trench 122 is different than the trench 120, and the trench 122 is not formed completely through the silicon layer 102. Therefore, trench 122 does not reach the underlying buried oxide layer 116. As shown in FIG. 6, in this embodiment the methods provide a liner 124 in the bottom of the recess 122. All of the liners mentioned herein can comprise any suitable material, such as those insulators mentioned above, and in one example comprise oxide liners. The methods provide such an oxide liner 124 by growing an oxide material in the recess 122 and removing the oxide material from the sidewalls of the recess 122 (depositing or forming a non-conformal oxide which is thicker on the horizontal surface and thinner on the vertical surfaces, and using a timed etch to completely remove the thinner oxide from the vertical surfaces, but leaving non-conformal oxide on the horizontal surface) to leave the oxide liner 124 only on the bottom of the recess 122.

Then, the embodiments herein again epitaxially grow the silicon carbon 130 from the sidewalls of the recess 122 (FIG. 7) to fill the recess 122 with the silicon carbon 130 (FIG. 8) in the same manner as discussed above. The silicon carbon region 130 again comprises a lattice structure aligned along the 110 plane relative to a lattice structure within the silicon substrate 102.

To the contrary, if the oxide liner 124 were not utilized, the silicon carbon 130 would simultaneously grow from the trench sidewalls and the bottom of the trench and these different growth regions would intersect each other along diagonal boundaries (relative to the parallel and perpendicular surfaces of the sidewalls and bottom of the recess 122). The silicon carbon would, therefore, be formed of multiple crystalline orientations (100 and 110) formed at diagonals to each other, which would dramatically increase the chance for defects within the silicon carbon region. The reason for this is that the points within the silicon carbon region where the different crystalline orientations meet often have structural defects, openings, and other non-uniformities that disadvantageously alter the structural nature of the silicon carbon region. By utilizing the underlying buried oxide layer 116 or the oxide liner 124, the crystalline orientation within the silicon carbon region 130 is made uniform (as it is grown only from the parallel planes of the sidewalls of the trench 122) and such defects are avoided.

Figure 9:
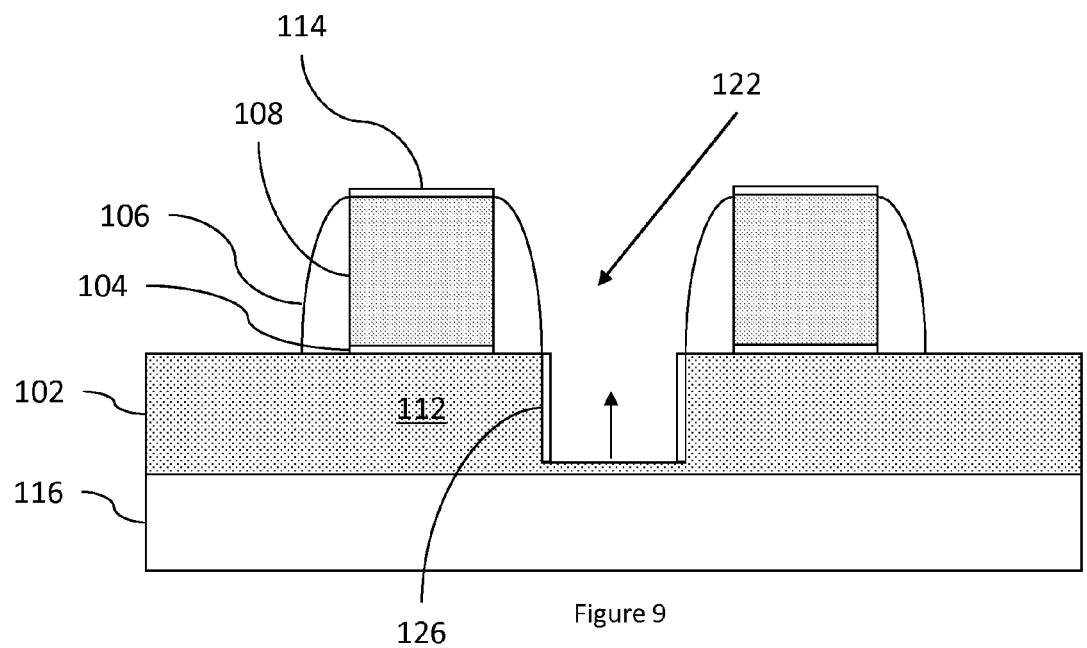
FIG. 9 is a cross-sectional schematic diagram of an integrated circuit device according to embodiments herein.
Figure 10:
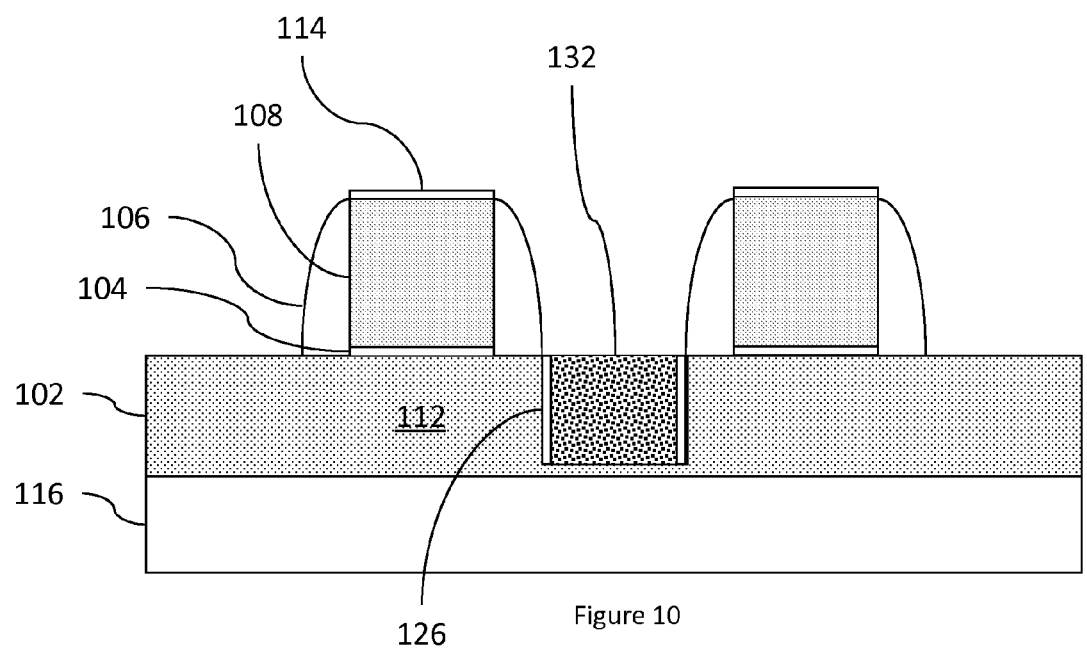
FIG. 10 is a cross-sectional schematic diagram of an integrated circuit device according to embodiments herein.

In another embodiment illustrated in FIG. 9, the same partial trench 122 discussed above with reference to FIG. 5 is utilized. However, in FIG. 9, rather than forming an oxide liner 124 along the bottom of the trench 122, oxide liners 126 are formed on the sidewalls of the trench 122 leaving the silicon material (102) at the bottom of the trench 122 exposed. Then, as shown by the arrow in the bottom of the trench and FIG. 9, silicon carbon material 132 is grown within the trench 122 (FIG. 10). Because this silicon carbon material 132 is grown from a different plane (that is perpendicular to the sidewall planes) it has a crystalline orientation that is perpendicular and the crystalline orientation of the previously discussed silicon carbon region 130, and the silicon carbon region 132 shown in FIG. 10 is aligned along the 100 plane relative to the lattice structure within the silicon substrate 102.

Figure 11:
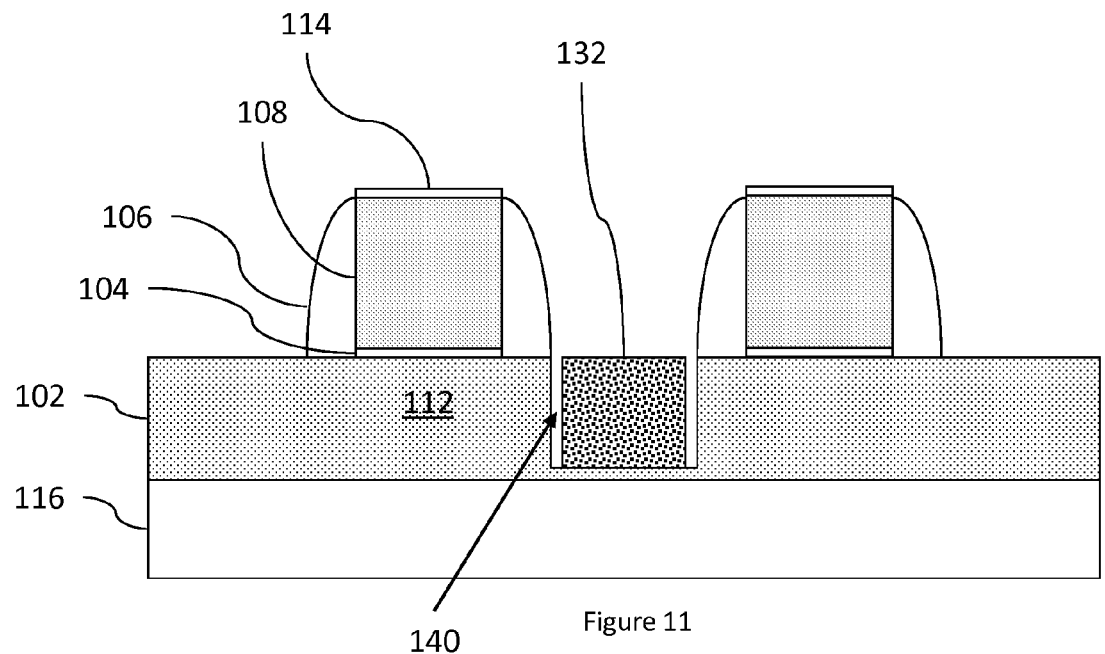
FIG. 11 is a cross-sectional schematic diagram of an integrated circuit device according to embodiments herein.

Because the oxide liners 126 are relatively much smaller than the area of the silicon carbon region 132, in some embodiments, the oxide liners 126 can be left in the final structure. In other embodiments, the oxide liners 126 can be removed as illustrated in FIG. 11 using a selective removal material that attacks oxide but does not attack the other exposed structures. This produces gaps (narrow trenches or grooves) 140 between the sidewalls of the trench 122 and the sidewalls of the silicon carbon region 132. Then, as shown in FIG. 12, second silicon carbon material 130 can be grown from the sidewalls, as was done above.

Figure 12:
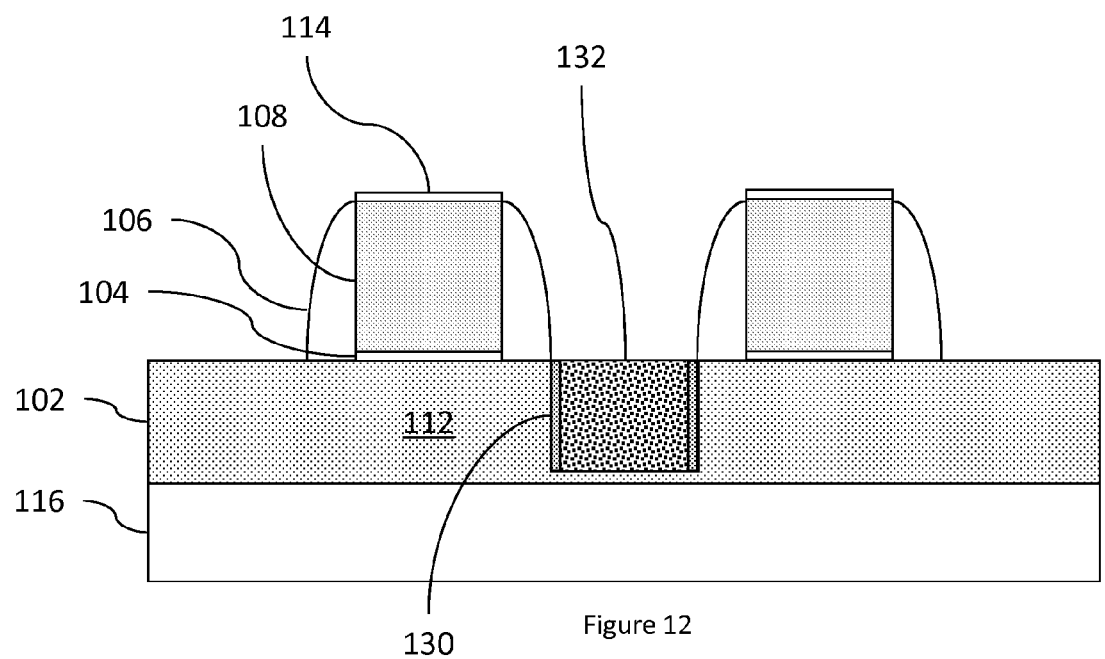
FIG. 12 is a cross-sectional schematic diagram of an integrated circuit device according to embodiments herein.

Therefore, in the embodiment shown in FIG. 12, a first silicon carbon region 132 is grown upwardly from the bottom of the recess 122 toward a top of the recess 122 during a first epitaxially growth process. Then a second silicon carbon region 132 is grown inwardly from the sidewalls of the recess 122 toward the sidewalls of the first silicon carbon region 132 during a second epitaxially growth process to fill the gaps 140.

As is mentioned above, the first silicon carbon region 132 is aligned along the 100 plane relative to the lattice structure within the silicon substrate 102 (because it has grown from the bottom of the trench 122) and the second silicon carbon region 130 is aligned along the 110 plane relative to the lattice structure within the silicon substrate 102 (because it has grown from the sidewalls of the trench 122). Because the second silicon carbon region 130 is relatively much smaller than the area of the first silicon carbon region 132, and because the two regions are formed along a line that is parallel to the sidewalls of the trench, the second silicon carbon region 130 will not cause defects within the structure.

Figure 13:
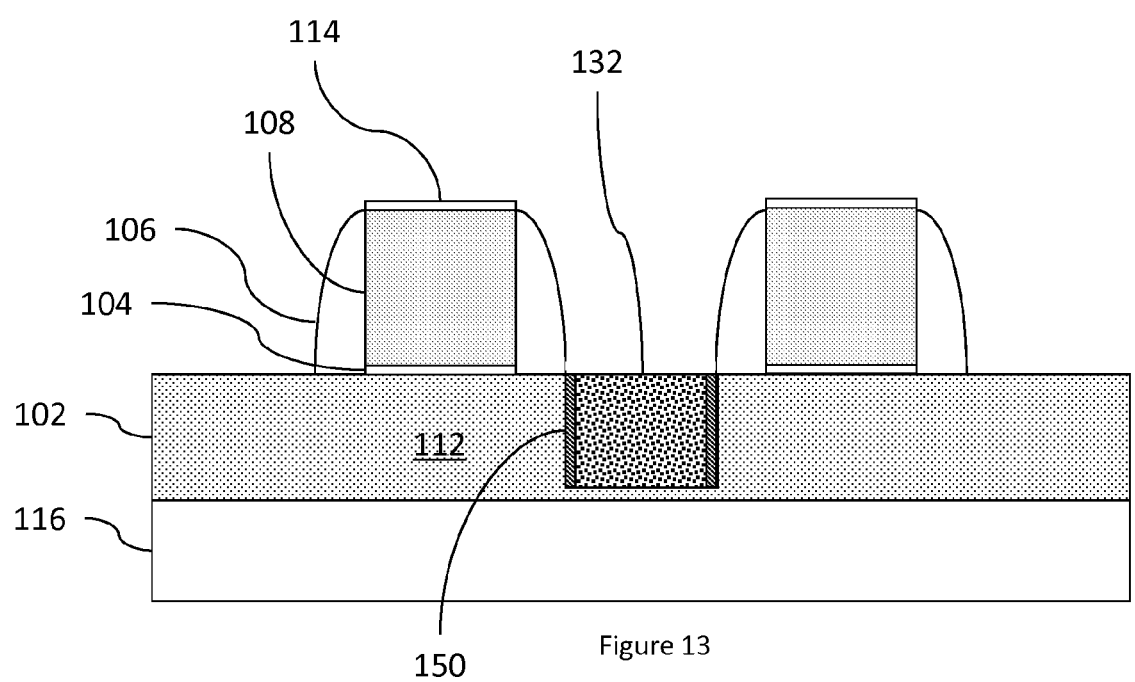
FIG. 13 is a cross-sectional schematic diagram of an integrated circuit device according to embodiments herein.

An additional embodiment is shown in FIG. 13. The structure shown in FIG. 13 is similar to the structure shown in FIG. 10; however in FIG. 13 rather than forming an oxide liner 126, in FIG. 13, conductive or semiconductive material 150 (such as any of the conductive or semiconductive materials mentioned above) is formed along the sidewalls of the trench 122. The same processes as discussed above are utilized, and this embodiment merely substitutes a different material (conductor) for the insulator that is used above. This conductor/semiconductor 150 is left permanently within the structure. The conductor/semiconductor 150 is generally high tensile stress material which helps transfer the stress produced by the silicon carbon region 132.

Thus, as mentioned above, if the oxide materials 116, 124, 126 were not utilized, the silicon carbon would simultaneously grow from the trench sidewalls and the bottom of the trench. The silicon carbon would, therefore, be formed of multiple crystalline orientations (100 and 110) formed at diagonals to each other, which would dramatically increase the chance for defects within the silicon carbon region. However, by utilizing the underlying buried oxide layer 116, the oxide liners 124 126, or the conductive liner 150, the crystalline orientation within the silicon carbon regions 130, 132 is made uniform (as it is grown only from the parallel planes of the sidewalls of the trench 122) and such defects are avoided.

The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit the invention because, as would be understood by those ordinarily skilled in the art, the invention is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
   forming at least two gate stacks on a silicon substrate;
   forming sidewall spacers on sides of said gate stacks;
   patterning a recess in said silicon substrate between adjacent ones of said gate stacks;
   providing an insulating liner in a bottom of said recess; and
   epitaxially growing material from sidewalls of said recess to fill said recess with an epitaxial material,
   said providing of said insulating liner comprising any one of the following:
      patterning said recess through said silicon substrate into an underlying insulator layer such that said bottom of said recess comprises said insulator layer; and
      lining said sidewalls and said bottom of said recess with said insulating liner such that a horizontal portion of said insulating liner on said bottom surface is relatively thin compared to vertical portions on said sidewalls; and isotropically etching said insulating liner until said vertical portions are removed such that said horizontal portion remains.

2. The method according to claim 1, said insulating liner comprising an oxide liner.

3. The method according to claim 1, said patterning of said recess utilizing said sidewall spacers as alignment features.

4. The method according to claim 1, said epitaxial material comprising a uniform lattice structure aligned along a 110 plane relative to a lattice structure of said silicon substrate.

5. The method according to claim 1, said epitaxial material growing inwardly from said sidewalls of said recess toward a center of said recess during said epitaxially growing of said epitaxial material.

6. The method according to claim 1, said forming of said gate stacks comprising:
   forming a gate oxide layer;
   patterning gate conductors on said gate oxide layer; and
   patterning caps on said gate conductors.

7. A method comprising:
   forming at least two gate stacks on a silicon substrate;
   forming sidewall spacers on sides of said gate stacks;
   patterning a recess in said silicon substrate between adjacent ones of said gate stacks;
   providing a liner along sidewalls of said recess; and
   epitaxially growing material from a bottom of said recess to fill said recess with an epitaxial material such that said epitaxial material is positioned laterally between said liner from said bottom surface to a top surface of said trench, said epitaxial material comprising an epitaxial silicon carbon material.

8. The method according to claim 7, said providing of said liner comprising forming an oxide liner in said recess and removing said oxide liner from said bottom of said recess to leave said oxide liner on said sidewalls of said recess.

9. The method according to claim 7, said patterning of said recess utilizing said sidewall spacers as alignment features.

10. The method according to claim 7, said epitaxial material comprising a uniform lattice structure aligned along a 100 plane relative to a lattice structure of said silicon substrate.

11. The method according to claim 7, said epitaxial material growing upwardly from said bottom of said recess toward a top of said recess during said epitaxially growing of said epitaxial material.

12. The method according to claim 7, said forming of said gate stacks comprising:
   forming a gate oxide layer;
   patterning gate conductors on said gate oxide layer; and
   patterning caps on said gate conductors.

13. A method comprising:
   forming at least two gate stacks on a silicon substrate;
   forming sidewall spacers on sides of said gate stacks;
   patterning a recess in said silicon substrate between adjacent ones of said gate stacks;
   providing a liner along sidewalls of said recess;
   epitaxially growing a first epitaxial material from a bottom of said recess to fill said recess with said first epitaxial material;
   removing said liner from said sidewalls of said recess to create gaps between said sidewalls of said recess and sidewalls of said first epitaxial material; and epitaxially growing a second epitaxial material from said sidewalls of said recess to fill said gaps with said second epitaxial material.

14. The method according to claim 13, said providing of said liner comprising forming an oxide liner in said recess and removing said oxide liner from said bottom of said recess to leave said oxide liner on said sidewalls of said recess.

15. The method according to claim 13, said patterning of said recess utilizing said sidewall spacers as alignment features.

16. The method according to claim 13, said first epitaxial material comprising a lattice structure aligned along a 100 plane relative to a lattice structure within said silicon substrate; and said second epitaxial material comprising a lattice structure aligned along a 110 plane relative to said lattice structure of said silicon substrate.

17. The method according to claim 13, said first epitaxial material growing upwardly from said bottom of said recess toward a top of said recess during said epitaxially growing of said first epitaxial material; and said second epitaxial material growing inwardly from said sidewalls of said recess toward said sidewalls of said first epitaxial material during said epitaxially growing of said second epitaxial material.

18. The method according to claim 13, said forming of said gate stacks comprising:
forming a gate oxide layer;
patterning gate conductors on said gate oxide layer; and
patterning caps on said gate conductors.

19. A method comprising:
forming at least two gate stacks on a silicon substrate;
forming sidewall spacers on sides of said gate stacks;
patterning a recess in said silicon substrate between adjacent ones of said gate stacks;
forming one of a conductor and a semiconductor along sidewalls of said recess; and
epitaxially growing epitaxial material from a bottom of said recess to fill said recess with said epitaxial material.

20. The method according to claim 19, said forming one of a conductor and a semiconductor comprising forming said one of a conductor and a semiconductor in said recess and removing said one of a conductor and a semiconductor from said bottom of said recess to leave said one of a conductor and a semiconductor on said sidewalls of said recess.

21. The method according to claim 19, said patterning of said recess utilizing said sidewall spacers as alignment features.

22. The method according to claim 19, said epitaxial material comprising a lattice structure aligned along a 100 plane relative to a lattice structure of said silicon substrate.

23. The method according to claim 19, said epitaxial material growing upwardly from said bottom of said recess toward a top of said recess during said epitaxially growing of said epitaxial material.

24. The method according to claim 19, said forming of said gate stacks comprising:
forming a gate oxide layer;
patterning gate conductors on said gate oxide layer; and
patterning caps on said gate conductors.

* * * * *